(12) United States Patent
Zhou

(10) Patent No.: US 11,658,076 B2
(45) Date of Patent: May 23, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 54 days.

(21) Appl. No.: 17/340,620

(22) Filed: Jun. 7, 2021

(65) Prior Publication Data

US 2021/0296186 A1  Sep. 23, 2021

Related U.S. Application Data

(62) Division of application No. 16/502,295, filed on Jul. 3, 2019, now Pat. No. 11,062,962.

(30) Foreign Application Priority Data

Jul. 5, 2018 (CN) .......................... 201810729569.X

(51) Int. Cl.
- *H01L 21/8238* (2006.01)
- *H01L 29/66* (2006.01)
- *H01L 27/092* (2006.01)
- *H01L 29/78* (2006.01)

(52) U.S. Cl.
CPC ........... *H01L 21/823878* (2013.01); *H01L 21/823821* (2013.01); *H01L 27/0924* (2013.01); *H01L 29/6681* (2013.01); *H01L 29/785* (2013.01)

(58) Field of Classification Search
CPC ..... H01L 21/823878; H01L 21/823821; H01L 27/0924; H01L 29/6681; H01L 29/785; H01L 27/1104
See application file for complete search history.

(56) References Cited

U.S. PATENT DOCUMENTS

| | | | |
|---|---|---|---|
| 2015/0311201 A1* | 10/2015 | Ju | H01L 27/0924 438/283 |
| 2016/0079354 A1* | 3/2016 | Park | H01L 27/0886 257/386 |
| 2017/0005014 A1* | 1/2017 | Yamashita | H01L 23/5226 |

(Continued)

*Primary Examiner* — Jonathan Han
(74) *Attorney, Agent, or Firm* — Anova Law Group, PLLC

(57) ABSTRACT

Semiconductor devices are provided. An exemplary semiconductor device includes a semiconductor substrate having a first region. The first region includes a first middle region and a first edge region adjacent to and surrounding the first middle region; and a surface of the first middle region of the semiconductor substrate is higher than a surface of the first edge region of the semiconductor substrate. The semiconductor device also includes a plurality of first fins discretely formed on the first middle region of the semiconductor substrate; and an isolation structure formed on the first middle region of the semiconductor substrate and the first edge region of the semiconductor substrate and covering portions of sidewall surfaces of the first fins.

8 Claims, 6 Drawing Sheets

(56) References Cited

U.S. PATENT DOCUMENTS

| | | | | |
|---|---|---|---|---|
| 2018/0342607 A1* | 11/2018 | Hu | ............... | H01L 21/02255 |
| 2019/0355729 A1* | 11/2019 | Liaw | ............... | H01L 27/0207 |
| 2019/0393040 A1* | 12/2019 | Chen | ............... | H01L 27/0924 |

* cited by examiner

SEMICONDUCTOR DEVICE AND FABRICATION METHOD THEREOF

CROSS-REFERENCES TO RELATED APPLICATIONS

This application is a divisional of U.S. patent application Ser. No. 16/502,295, filed on Jul. 3, 2019, which the priority of Chinese patent application No. 201810729569.X, filed on Jul. 5, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

With the rapid development of the semiconductor manufacturing technologies, semiconductor devices are moving toward higher component densities and higher integration levels. As the most basic components of integrated circuits (ICs), semiconductor devices have been widely used. With the continue reduction of the critical dimension (CD) of semiconductor devices, the control ability of the traditional planar semiconductor device to the channel current has been reduced; and a short channel effect occurs; and a leakage current is correspondingly generated. Accordingly, the electrical performance of the semiconductor device is adversely affected.

To overcome the short channel effect of the semiconductor device and suppress the leakage current, fin field-effect transistors (FinFETs) have been developed. FinFETs are common multi-gate devices. A FinFET often includes a fin and an isolation layer on a surface of a semiconductor substrate. The isolation layer covers portions of the sidewall surfaces of the fin; and the surface of the isolation layer is lower than the top surface of the fin. The FinFET also includes a gate structure on the surface of the isolation layer, and the top and sidewall surfaces of the fin; and source/drain regions in the fin at both sides of the gate structure.

However, the performance of the FinFET needs to be further improved. The disclosed methods and semiconductor structures are directed to solve one or more problems set forth above and other problems in the art.

BRIEF SUMMARY OF THE DISCLOSURE

One aspect of the present disclosure includes a semiconductor device. The semiconductor device may include a semiconductor substrate having a first region. The first region may include a first middle region and a first edge region adjacent to and surrounding the first middle region; and a surface of the first middle region of the semiconductor substrate is higher than a surface of the first edge region of the semiconductor substrate. The semiconductor device may also include a plurality of first fins discretely formed on the surface of the first middle region of the semiconductor substrate; and an isolation structure formed on the first middle region of the semiconductor substrate and the first edge region of the semiconductor substrate and covering portions of sidewall surfaces of the first fins.

Another aspect of the present disclosure includes a method for fabricating semiconductor device. The method may include providing a base substrate having a first region. The first region may include a first middle region and a first edge region adjacent to and surrounding the first middle region. The method may also include etching the first middle region of the base substrate to form a first trench in the first region of the base substrate; and etching the first edge region of the base substrate to form a first groove. A bottom surface of the first groove may be lower than a bottom surface of the first trench. Portions of the base substrate between the first groove and the first trench and portions of the base substrate between adjacent first grooves form first fins; and portions of the base substrate under the first trench, the first grooves and the first fins are configured as a first region of a semiconductor substrate. Further, the method may include forming an isolation structure on a surface of the semiconductor substrate to cover portions of sidewall surfaces of the first fins.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
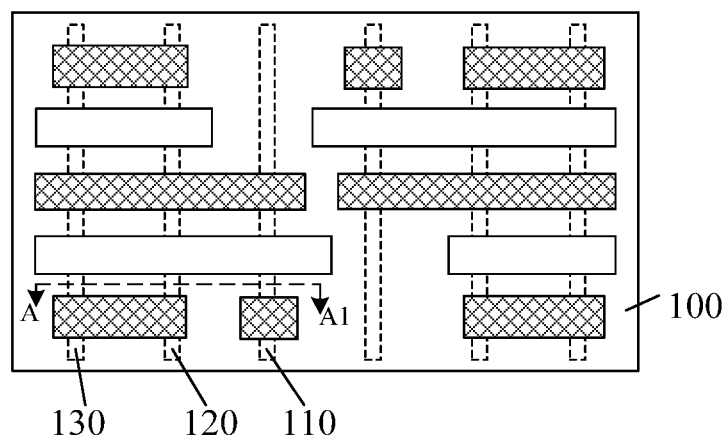
FIGS. 1-2 illustrate a static random access memory (SRAM) device.
Figure 2:
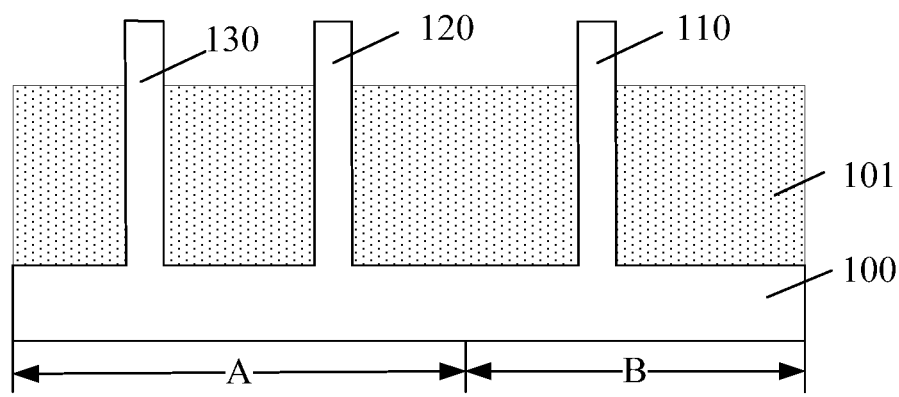

FIGS. 1-2 illustrate an SRAM device. FIG. 2 is an A-A1-sectional view of the structure illustrated in FIG. 1; and FIG. 1 is a top view of the SRAM device. As shown in FIGS. 1-2, the SRAM device includes a semiconductor substrate 100; and a first fin 110, a second fin 120 and a third fin 130 on the semiconductor substrate 100. The second fin 120 is located between the first fin 110 and the third fin 130. The SRAM device also includes an isolation structure 101 is formed on the surface of the semiconductor substrate 100; and the isolation structure 101 covers the sidewall surfaces of the first fin 110, the second fin 120, and the third fin 130. Further, the SRAM device includes a gate structure across the first fin 110, the second fin 120, and the third fin 130; and doped source/drain regions at both sides of the gate structure; and conductive structures on the surfaces of the doped source/drain regions at both sides of the gate structure.

The first fin 100 is used to form a pull-up transistor; and the second fin 120 and the third fin 130 are used to form pull-down transistors. The pull-up transistor is a P-type transistor, and the pull-down transistors are N-type transistors. Because the type of the transistor formed by the first fin 110 and the type of the transistors formed by the second fin 120 and the third fin 130 are different, a field isolation is required between the different types of transistors. To avoid affecting the performance of the formed SRAM device, the thickness of the isolation structure 101 needs to be substantially thick to prevent the leakage current between different transistors. However, the substantially thick isolation structure 101 tends to cause a poor heat dissipation performance; and a serious self-heating effect occurs. Accordingly, the performance of the formed SRAM device is adversely affected.

The present disclosure provides a semiconductor device and a method for fabricating a semiconductor device. In the disclosed fabrication method, a semiconductor substrate having a middle region and an edge region may be formed. The surface of the middle region may be higher than the surface of the edge region. A plurality of discrete fins may be formed on the middle region of the semiconductor substrate; and an isolation structure covering the sidewall surfaces of the fins may be formed on the surface of the semiconductor substrate. The portion of the isolation structure in the middle region may be thinner than the portion of the isolation structure in the edge region. The thicker portion of the isolation structure in the edge region may realize the field isolation between different types of semiconductor devices. The thinner portion of the isolation structure in the middle portion may cover less portions of the fins; and may dissipate the heat generated by the fins in the middle region substantially quick. Thus, the self-heating effect of the device may be reduced; and the performance of the semiconductor device may be improved.

Figure 12:
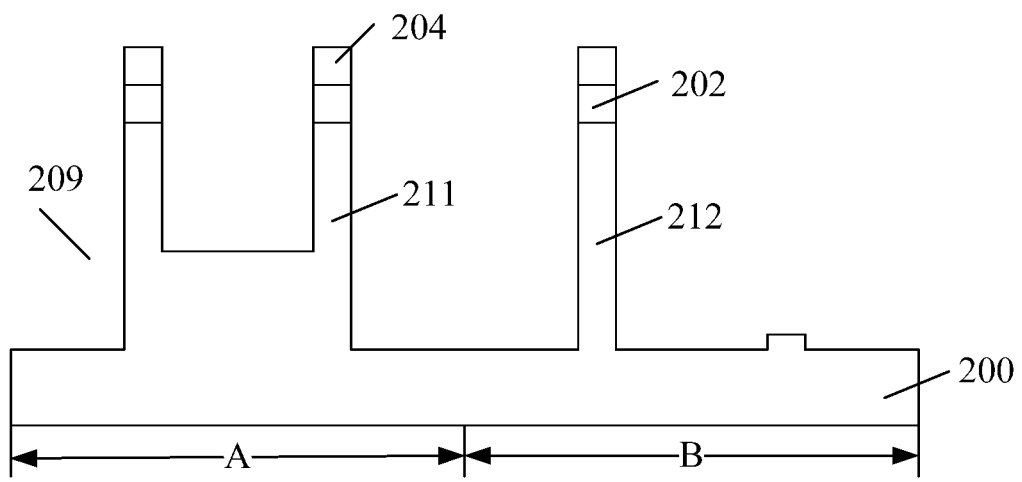
Figure 13:
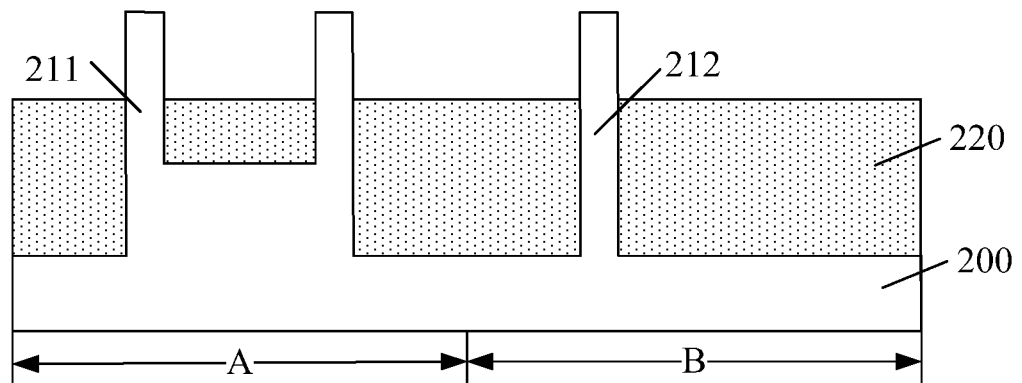
Figure 14:
FIG. 14 illustrates an exemplary fabrication process of a semiconductor device consistent with various disclosed embodiments.

FIG. 14 illustrates an exemplary fabrication process of a semiconductor device. FIGS. 3-13 illustrate structures corresponding to certain stages during the exemplary fabrication process consistent with various disclosed embodiments.

Figure 3:
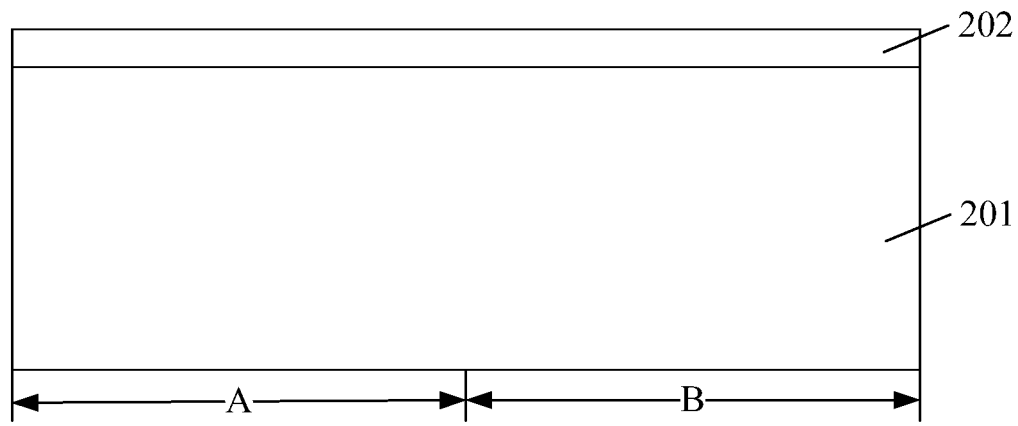
FIGS. 3-13 illustrate structures corresponding to certain stages during an exemplary fabrication process of a semiconductor device consistent with various disclosed embodiments.

As shown in FIG. 14, at the beginning of the fabrication process, a base substrate is provided (S101). FIG. 3 illustrates a corresponding structure.

As shown in FIG. 3, a base substrate 201 is provided. The base substrate 201 may include a first region A and a second region B.

The first region A may include a first middle region and a first edge region. The first edge region may be adjacent to the first middle region; and may surround the first middle region.

The conductivity types of the semiconductor devices formed in the first region A may be the same. In particular, the semiconductor devices formed in the first region A may be all P-type devices, or may be all N-type devices.

In one embodiment, the material of the base substrate 201 is single crystal silicon. The base substrate 201 may also be made of polysilicon, or amorphous silicon. Further, The material of the base substrate 201 may also be other appropriate semiconductor material, such as germanium, silicon germanium, or gallium arsenide, etc. The base substrate 201 may be also be a semiconductor-on-insulator structure including an insulator and a semiconductor material layer on the insulator. The semiconductor material layer may be silicon, germanium, silicon germanium, gallium arsenide, or indium gallium arsenic, etc.

In one embodiment, the base substrate 201 may also include the second region B; and the second region B may be adjacent to the first region A. The conductive type of the semiconductor device formed in the first region A may be different from the conductive type of the semiconductor device formed in the second region B.

The first region A may be used for forming P-type devices. The second region B may be used for forming N-type devices. In some embodiments, the first region A may be used for forming N-type devices; and the second region B may be used for forming P-type devices.

In one embodiment, the first region A is used for forming N-type transistors; and the second region B is used for forming P-type transistors.

The second region B of the base substrate 210 may include a second middle region and a second edge region. The second edge region may be located at both sides of the second middle portion.

In one embodiment, the second region B of the base substrate 201 is not partitioned. In particular, the second region B is only a single region.

In one embodiment, a protective layer 202 may be formed the surface of the base substrate 201. The protective layer 202 may be formed on the surface of the base substrate 201 in the first region A and the second region B. The protective layer 202 may be used to protect the base substrate 201.

The protective layer 202 may be made of any appropriate material, such as silicon oxide, silicon nitride, silicon oxynitride, silicon boronitride, silicon oxynitride, or silicon oxynitride, etc. In one embodiment, the protective layer 202 is made of silicon oxide. In another embodiment, the protective layer 202 is made of silicon nitride.

After forming the protective layer, a first trench may be formed in the first middle region of by performing a first etching process to the first region of the base substrate.

The method for forming the first trench may include forming a first mask layer exposing a portion of the surface of the base substrate on the surface of the base substrate; and etching the base substrate using the first mask layer as an etching mask to form the first trench in the first middle region the of base substrate.

In one embodiment, the method for forming the first mask layer may include forming a first assistant pattern layer on the base substrate to cover a portion of the surface of the base substrate; forming an initial first mask covering the top and sidewall surfaces of the first assistant pattern layer on the surface of the base substrate; etching back the initial first mask layer to expose a top surface of the first assistant pattern layer; and removing the first assistant pattern layer to expose a portion of the surface of the base substrate to form the first mask layer.

In one embodiment, the first assistant pattern layer is formed on the base substrate; and the first assistant pattern layer may cover a portion of the surface of the base substrate. After forming the first assistant pattern layer, a second mask layer may be formed between the sidewall surfaces of the first assistant pattern layer and an adjacent first assistant pattern layer. The second mask layer may be formed on the surface of the base substrate; and may cover the sidewall surfaces of the first assistant pattern layer. The first mask layer and the second mask layer may be used together as an etching mask to etch the base substrate to form the first trench in the first middle region of the base substrate. The structures corresponding to certain stages during forming the first trench may refer to FIGS. 4-7.

Figure 4:
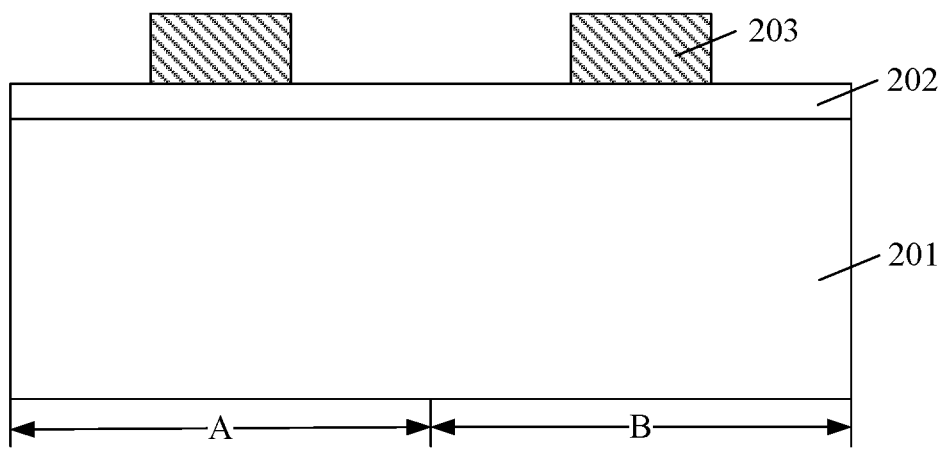

Returning to FIG. 14, after forming the protective layer, a first assistant pattern layer may be formed (S102). FIG. 4 illustrates a corresponding structure.

As shown in FIG. 4, a first assistant pattern layer 203 may be formed on the base substrate 201. In particular, the first assistant pattern layer 203 may be formed on the surface of the protective layer 202.

The first assistant pattern layer 203 may provide an assistance for subsequently forming a first mask layer. The first assistant pattern layer 203 may determine the position and the shape of subsequently formed the first trench.

The first assistant pattern layer 203 may include a plurality of first assistant patterns. In a same region, the distance between adjacent first assistant patterns may be equal.

In one embodiment, the first assistant pattern layer 203 may also be formed on the surface of the second region B of the base substrate 201.

The method for forming the first assistant pattern layer 203 may include forming a first assistant pattern material layer (not shown) on the base substrate 201; forming a second patterned layer on the surface of the first assistant pattern material layer to cover portions of the surface of the protective layer 202; etching the first assistant pattern material layer using the second patterned layer as an etching mask until the surface of the base substrate 201 is exposed to form the first assistant pattern layer 203 on the surface of the base substrate 201.

In one embodiment, the first assistant pattern layer 203 may be only formed on the surface of the first middle region of the base substrate 201.

In another embodiment, the first assistant pattern layer 203 may also be formed on the surface of the base substrate 201 in the second middle region of the second region B.

The first assistant pattern material layer may be made of any appropriate material, such as amorphous carbon, or amorphous silicon, etc. In one embodiment, the first assistant pattern material layer is made of amorphous carbon.

The distance between the adjacent first assistant patterns may determine the size of the subsequently formed first fins, or the second fins. The size of the first assistant patterns may determine the distance between the subsequently formed adjacent first fins.

Figure 5:
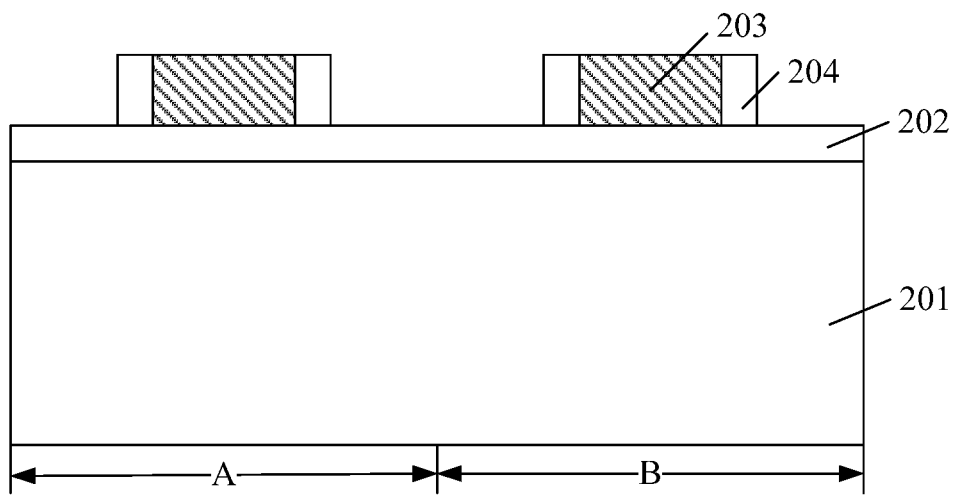

Returning to FIG. 14, after forming the first assistant pattern layer, a second mask layer may be formed (S103). FIG. 5 illustrates a corresponding structure.

As shown in FIG. 5, a second mask layer 204 is formed on the sidewall surfaces of the first assistant pattern layer 203 and between adjacent first assistant patterns. The second mask layer 204 may be used as a mask layer for subsequently forming the first fins; and may protect the surface of the base substrate 201 when the first trench is subsequently formed. The second mask layer 204 may determine the positions and the shapes of the subsequently formed first fins.

The second mask layer 204 may be made of any appropriate material, such as silicon oxide, silicon nitride, silicon oxynitride, silicon borohydride, or silicon oxynitride, etc. In one embodiment, the second mask layer 204 is made of silicon nitride. In another embodiment, the second mask layer 204 is made of silicon oxynitride.

In one embodiment, the second mask layer 204 may also be formed on the surface of the second region B of the base substrate 201.

The method for forming the second mask layer 204 may include forming an initial second mask layer (not shown) on the base substrate 201 to cover and protect the surface of the protective layer 202 and the top and sidewall surfaces of the first assistant pattern layer 203 and fill the openings between adjacent first assistant patterns; and etching back the initial second mask layer to form the second mask layer 204 between adjacent first assistant patterns and the sidewall and top surfaces of the first assistant patter layer 203.

In one embodiment, the second mask layer 204 may only be formed on the surface of the base substrate 201 in the first middle region of the first region A. In another embodiment, the second mask layer 204 may be also be on the surface of the base substrate 201 in the second middle region of the second region B.

In one embodiment, the distance between adjacent first assistant patterns is substantially the same. The width of the second mask layer 204 along a direction parallel to the surface of the base substrate 201 may be substantially equal to the width of the second mask layer 204 along the direction perpendicular to the length direction of the first fin.

In another embodiment, the distance between adjacent first assistant patterns may be different; and the width of the second mask layer 204 along a direction parallel to the surface of the base substrate 201 may be different from the width of the second mask layer 204 along the direction perpendicular to the length direction of the first fin. The width of the subsequently formed first fin along the direction parallel to the surface of the base substrate may be different from the width of the first fin along the direction perpendicular to the length direction of the first fin.

Figure 6:
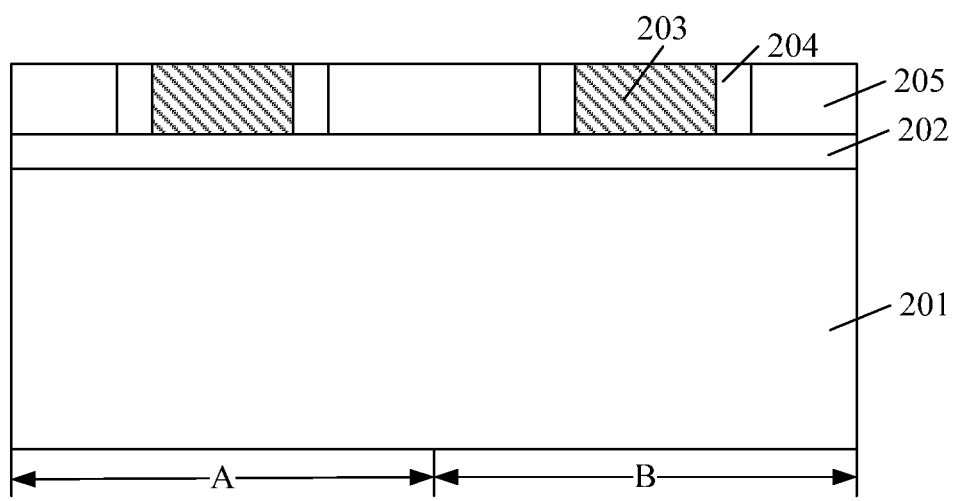

Returning to FIG. 14, after forming the second mask layer, a first mask layer may be formed (S104). FIG. 6 illustrates a corresponding structure.

As shown in FIG. 6, a first mask layer 205 may be formed on the base substrate 201. The first mask layer 205 may cover the top surface of the protective layer 202 and the sidewall surfaces of the second mask layer 204. The second mask layer 204 may expose the top surface of the first assistant pattern layer 203. The second mask layer 204 and the first mask layer 205 may be together used as a mask layer for subsequently forming a trench.

In one embodiment, the first mask layer 205 may also be formed on the surface of the base substrate 201 in the second region B.

The method for forming the first mask layer 205 may include forming an initial first mask layer (not shown) on the surface of the base substrate 201. The initial first mask layer may cover the top surface of the first assistant pattern layer 203, and the top surface and sidewall surfaces of the second mask layer 204. The method may also include etching the initial first mask layer to expose the top surface of the first assistant pattern layer 203 and the top surface of the second mask layer 204 to form the first mask layer 205.

The first mask layer 205 may be made of any appropriate material, such as an organic material, etc.

In one embodiment, the first mask layer 205 may only be formed on the surface of the base substrate 201 in the first middle region. In another embodiment, the first mask layer 205 may also be formed the surface of the base substrate 201 in the second middle region of the second region B.

Figure 7:
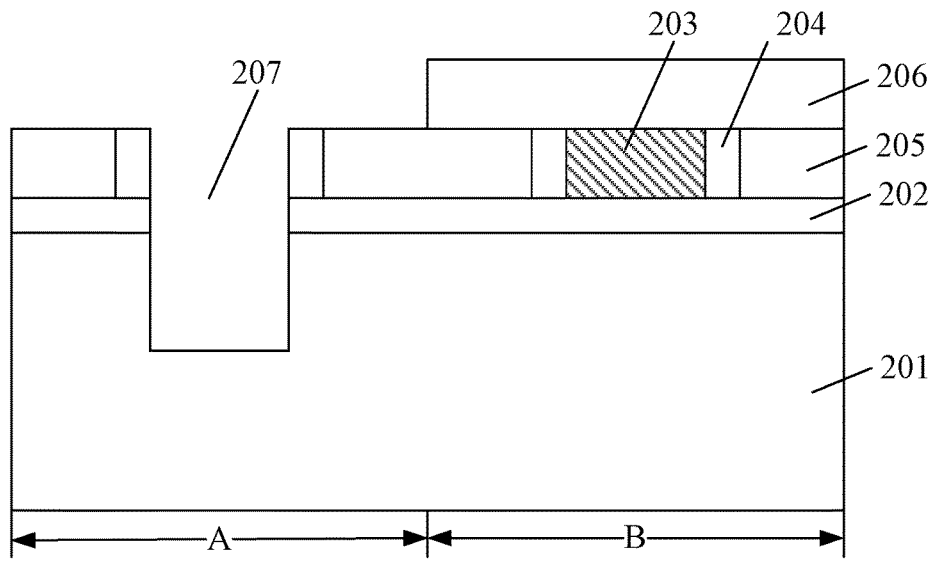

Returning to FIG. 14, after forming the first mask layer, a first trench may be formed (S105). FIG. 7 illustrates a corresponding structure.

As shown in FIG. 7, after forming the first mask layer 205, the base substrate 201 may be etched by using the second mask layer 204 and the first mask layer 205 as an etching mask to form a first trench 207 in the first middle region of the base substrate 201.

The bottom surface of the first trench 207 may be lower than the top surface of the base substrate 201. The distance between the bottom surface of the first trench 207 and the top surface of the base substrate 201 may be the height of the subsequently formed first fins. In one embodiment, the distance between the bottom surface of the first trench 207 and the top surface of the base substrate 201 may be in a range of approximately 600 angstroms to 900 angstroms.

Before etching the base substrate 201, the first assistant pattern layer 203 and a portion of the protective layer 202 on the surface of the base substrate 201 may be removed to expose the surface of the portion of base the substrate 201 and the sidewall surfaces of the second mask layer 204.

In one embodiment, the first trench 207 is only formed in the first middle region of the first region A of the base substrate 201. The first assistant pattern layer 203 on the surface of the base substrate 201 in the first region A and a portion of the protective layer 202 may be removed.

In one embodiment, at least a second trench may be formed in the second middle region of the second region B of the base substrate 201.

In one embodiment, after removing the first assistant pattern layer 203 in the first region A, the second mask layer 204 in the first region A and the protective layer 202 exposed by the first mask layer 205 may be removed.

The process for removing the first assistant pattern layer 203 in the first region A may include an anisotropic dry etching process, etc.

In one embodiment, the parameters of the dry etching process for removing the first assistant pattern layer 203 in the first region A may include following values. The etching gas may include $CF_4$, $O_2$ and He, etc. The flow rate of $CF_4$ may be in a range of approximately 20 sccm-300 sccm. The flow rate of 02 may be in a range of approximately 50 sccm-800 sccm. The flow rate of He may be in a range of approximately 10 sccm-60 sccm. The chamber pressure may be in a range of approximately 1 mTorr-200 mTorr. The power of the RF source may be in a range of approximately 500 W-2000 W. The bias voltage may be in a range of approximately 100 V-300 V. The etching time may be in a range of approximately is 20 seconds-2000 seconds.

The process for removing the second mask layer 204 in the first region A and the protective layer 202 exposed by the first mask layer 205 may include an anisotropic dry etching process, etc.

In one embodiment, as shown in FIG. 7, before removing the first assistant pattern layer 203 in the first region A, a third patterned layer 206 may be formed over the surface of the second region B. The third patterned layer 206 may cover the top surfaces of the first mask layer 205, the second mask layer 204, and the first assistant pattern layer 203 in the second region B.

In another embodiment, the third patterned layer may not be formed. The second assistant pattern layer 203 in the second region B may be removed during removing the second assistant pattern layer 203 in the first region A; and the at least one second trench may be formed in the second region B of the base substrate 201.

Figure 8:
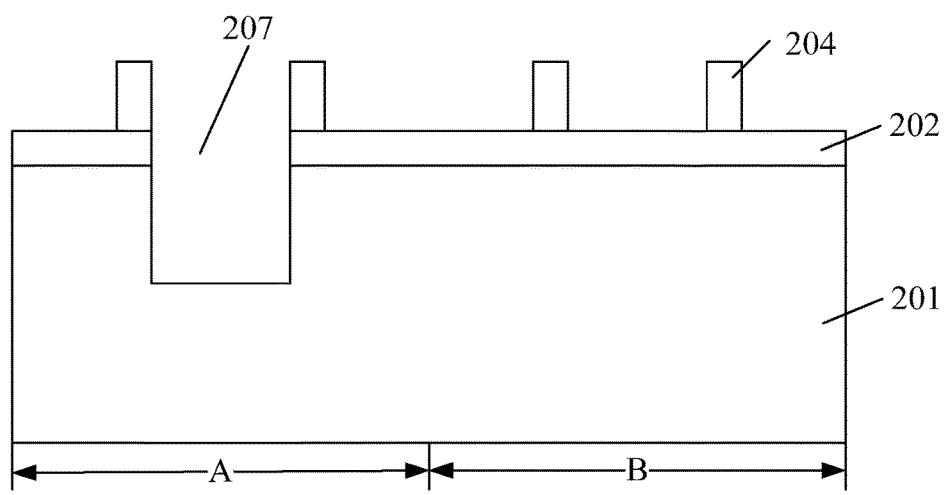

Returning to FIG. 14, after forming the first trench, the first mask layer may be removed (S106). FIG. 8 illustrates a corresponding structure.

As shown in FIG. 8, after forming the first trench 207, the first mask layer 205 may be removed to expose the top and sidewall surfaces of the second mask layer 204. In one embodiment, before removing the first mask layer 205, the third patterned layer 206 in the second region B may also be removed.

The process for removing the third patterned layer 206 in the second region B may include an ashing process, or a wet process, etc.

In one embodiment, before removing the first mask layer 205, the first assistant pattern layer 203 in the second region B may be removed to expose the sidewall surfaces of the second mask layer 204 and the top surface of the protective layer 202.

The process for removing the first assistant pattern layer 203 in the second region B may include a dry etching. The parameters of the dry etching process may include following values. The etching gas may include $CF_4$, $O_2$ and He, etc. The flow rate of $CF_4$ may be in a range of approximately 20 sccm-300 sccm. The flow rate of 02 may be in a range of approximately 50 sccm-800 sccm. The flow rate of He may be in a range of approximately 10 sccm-60 sccm. The chamber pressure may be in a range of approximately 1 mTorr-200 mTorr. The power of the RF source may be in a range of approximately 500 W-2000 W. The bias voltage may be in a range of approximately 100 V-300 V. The etching time may be in a range of approximately 20 seconds-2000 seconds.

The process for removing the first mask layer 205 may include a dry etching process.

In one embodiment, the parameters of the ashing process may have following values. The gases used in the ashing process may include $CH_4$, $H_2$, and $N_2$, etc. The flow rate of $CH_4$ may be in a range of approximately 15 sccm-200 sccm. The flow rate of $H_2$ may be in a range of approximately 300 sccm-900 sccm. The flow rate of $N_2$ may be in range of approximately 20 sccm-150 sccm. The power of the ashing process may be in a range of approximately 800 watts-2200 watts. The bias voltage may be in a range of approximately 80 volts to 200 volts. The chamber pressure may be in a range of approximately 10 mTor-2000 mTorr. The time of the ashing process may be in a range of approximately 10 seconds-500 seconds.

The second mask layer 204 may be used a mask layer for subsequently forming first fins or second fins.

In one embodiment, the second mask layer 204 may also be formed in the second region B.

Figure 9:
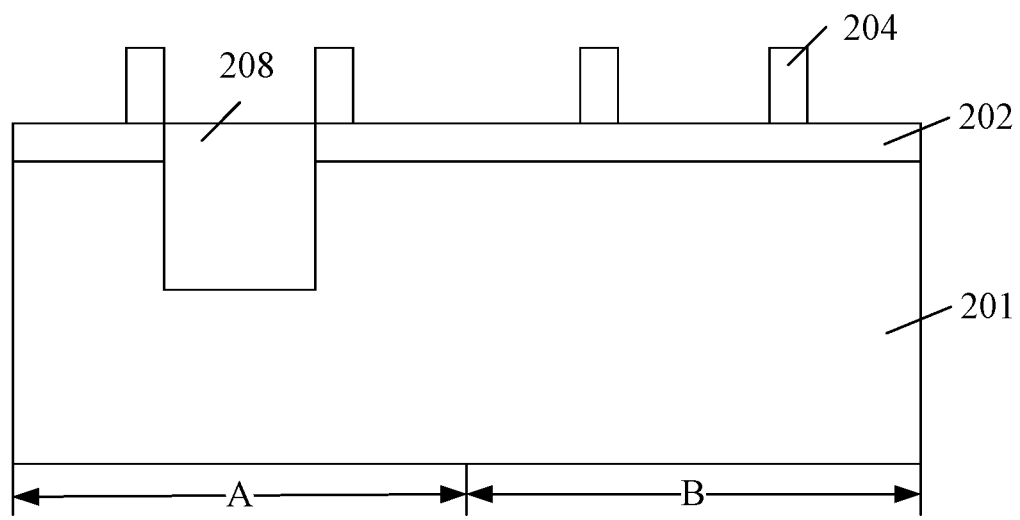
Figure 10:
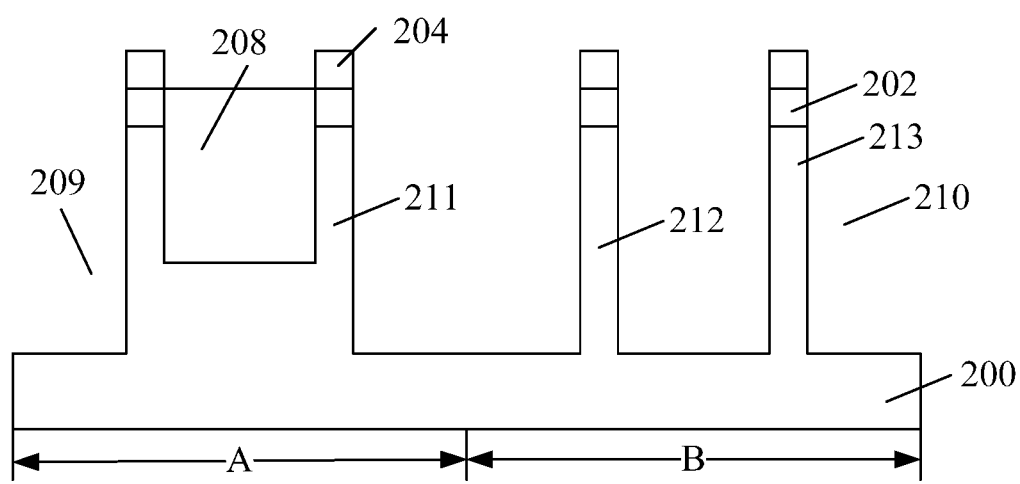

After forming the first trench 207, the base substrate 201 in the first edge region may be etched to form one or more first grooves. The bottom surface of the first groove may be lower than the bottom surface of the first trench. The portions of the base substrate 201 between the first trench and the adjacent first groove and the portions of the base substrate 201 between adjacent first trenches may form first fins. The base substrate 201 under the bottoms of the first grooves and bottoms of the first trenches may form a semiconductor substrate in the first region. FIGS. 9-10 illustrate structures corresponding to certain stages during the process for forming the first grooves.

Returning to FIG. 14, after removing the first mask layer, a first sacrificial layer may be formed in the first trench (S107). FIG. 9 illustrates a corresponding structure.

As shown in FIG. 9, after removing the first mask layer 205, a first sacrificial layer 208 may be formed in the first trench 207. The first sacrificial layer 208 may protect the base substrate 201 on the bottom of the first trench 207 during subsequently forming the first grooves.

The first sacrificial layer 208 may be made of any appropriate material, such as an organic material, etc.

The method for forming the first sacrificial layer 208 may include forming a first sacrificial material layer (not shown) on the base substrate 201 and in the first trench 207. The first sacrificial material layer may also cover the sidewall surfaces and the top surface of the second mask layer 204. Then, the first sacrificial material layer may be etched back until the surface of the protective layer 202 on the base substrate 201 is exposed. Thus, the first sacrificial layer 208 may be formed in the first trench 207.

In one embodiment, the first sacrificial layer 208 may be formed only in the first middle region of the first region A. In another embodiment, a second groove may be formed in the second middle region of the second region B; and a second sacrificial layer may be formed in the second groove during forming the first sacrificial layer 208 in the first trench 207.

Returning to FIG. 14, after forming the first sacrificial layer, a first groove may be formed (S108). FIG. 10 illustrates a corresponding structure.

As shown in FIG. 10, a first groove 209 may be formed in the first edge region of the first region A. The first groove 209 may be formed by etching the base substrate 201 using the first sacrificial layer 208 and the second mask layer 204 as an etching mask. The bottom surface of the first groove 209 may be lower than the bottom surface of the first trench 207.

The portion of the base substrate 201 between the first groove 209 and the adjacent first trench 207 and the portions of base substrate 201 between adjacent first trenches 207 may form first fins 211. The portion of the base substrate 201 under the bottom of the first trench 207 and the portions of the base substrate 201 under the first fins 211 may form a portion of a semiconductor substrate in the first region A.

The surface of the portion of the semiconductor substrate in the first middle region of the first region A may be higher the surface of the portion of the semiconductor substrate in the first edge region of the first region A.

The surface of the portion of the semiconductor substrate in the first middle region may be higher than the surface of the portion of the semiconductor substrate in the first edge region. The subsequently formed isolation structure may cover the surface of the semiconductor substrate in the first middle region. The isolation structure in the first edge region may be substantially thick; and may be able to realize a field isolation between different types of semiconductor devices. The isolation structure in the first middle region may be substantially thin; and the first fins may be subsequently formed in the first middle region; and the semiconductor device formed from the first fins may be close to the base substrate. Thus, it may easy for the heat to conduct to the base substrate; and the heat dissipation may be substantially fast. Accordingly, the self-heating effect of the semiconductor device may be reduced. Further, the heights of the first fins higher than the isolation structure may be the same. Thus, the performance of the semiconductor device may be stable. Thus, such a structure may be able to improve the performance of the semiconductor device.

The height difference between the surface of the portion of the semiconductor substrate in the first middle region of the first region A and the surface of the first edge region may be in a range of approximately 400 angstroms-600 angstroms. The distance between the top surface of the first fin 211 and the surface of the first edge region of the semiconductor substrate may be in a range of approximately 1000 angstroms-1500 angstroms.

The distance between the top surface of the first fin 211 and the surface of the first middle region of the semiconductor substrate may be the height of the first fin; and the distance may be in a range of approximately 600 angstroms-900 angstroms.

In one embodiment, the base substrate 201 may also include the second region B. The second mask layer 204 may also be formed on the second region B of the base substrate 201. When the first edge region of the base substrate 201 is etched using the first sacrificial layer 208 and the second mask layer 204 as an etching mask, the base substrate 201 in the second region B may also be etched, and the second groove 210 may be formed in the second region B of the base substrate 201.

The portions of the base substrate 201 between adjacent second grooves 210 may form the second fins 212. The base substrate 201 under the bottoms of the second fins 212 and the base substrate 201 under the bottoms of the second grooves 210 in the second region B may form a second region of the semiconductor substrate.

In one embodiment, the bottom surface of the second fin 212 may level with the bottom surface of the second groove. Thus, the semiconductor substrate in the second region B may be a planar structure.

In one embodiment, the first groove 209 and the second grooves 210 may be formed in a same process step. The bottom surface of the first groove 209 may level with the bottom surface of the second groove 210.

In one embodiment, the second region B may include the second middle region and the second edge region. The second groove may be formed in the second middle region of the second region B; and the second sacrificial layer may be formed in the second groove. The second mask layer 204 may also be formed on the second region B. When the base substrate 201 in the first edge region is etched using the first sacrificial layer 208 and the second mask layer 204 as a mask, the second sacrificial layer 208 and the second mask layer 204 on the second region B may also be used as a mask to etch the base substrate 201 in the second edge region of the second region B; and the second grooves 210 may be formed in the second region B.

The portions of the base substrate 201 between the second trench and the adjacent second groove and the portions of the base substrate 201 between the adjacent second grooves may form second fins 212.

The portions of the base substrate under the bottoms of the second trenches, the bottoms of the second grooves 210, and the portions of the base substrate 201 under the bottoms of the second fins 212 in the second region B may configured as the second region B of the semiconductor substrate.

The surface of the semiconductor substrate in the second middle region of the second region A may be higher than the surface of the second edge region.

The distance between the bottoms of the second grooves and the top surface of the base substrate 201 may be referred to as the height the second fins 212. When such a distance is too large, when the second grooves and the second fins are formed by an etching process, the shape of the second fins adjacent to the edge region of the second region may need to be improved. To ensure an acceptable shape of the second fins, a common method is to form an extra sacrificial fin besides the second fins. After forming desired second fins and the sacrificial fin, the sacrificial fin may be removed to form the desired second fins.

In one embodiment, for illustrative purposes, the number of the second fin 212 may be one. To ensure the morphology of the second fins 212, two second fins 212 may be often formed.

In one embodiment, the first assistant pattern layer 203 may be formed on the second region B of the base substrate 201 (refer to FIG. 7). The second mask 204 in the second region B may be formed at both sides of the first assistant pattern layer 203 in the second region B. When the first sacrificial layer 208 and the second mask layer 204 are used as a mask to etch the base substrate 201 in the first edge region, the base substrate 201 in the second region may be etched to form the second grooves 210. The portions of the base substrate 201 between the adjacent second grooves 210 may form the second fin 212 and the sacrificial fin 213. The fin in the second edge region of the second region B may be configured as the sacrificial fin 213.

Figure 11:
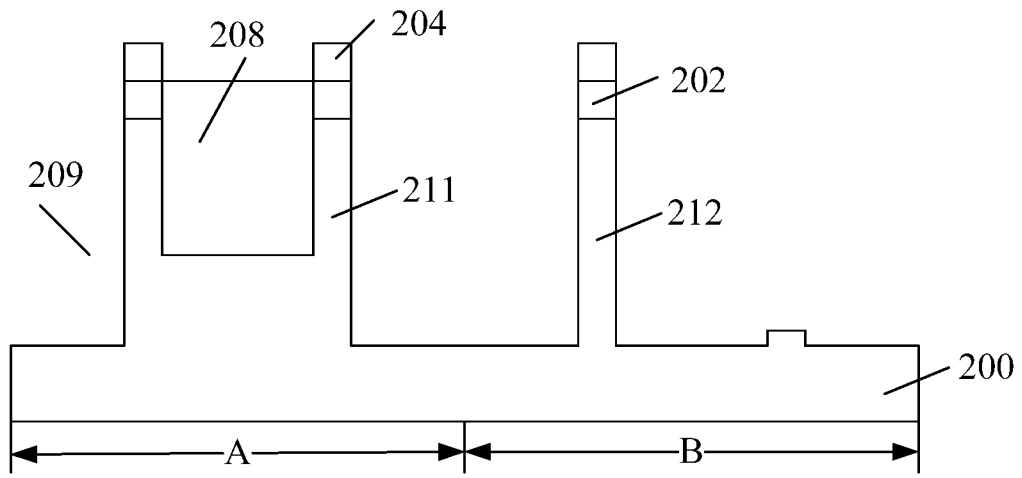

Returning to FIG. 14, after forming the second grooves, the sacrificial fin may be removed (S109). FIG. 11 illustrates a corresponding structure.

As shown in FIG. 11, after forming the second grooves 210, the sacrificial fin 213 in the edge region of the second region B may be removed.

The method for removing the sacrificial fin 213 in the edge region of the second region B may include forming a mask layer (not shown) on the semiconductor substrate to cover the top and sidewall surfaces of the second mask layer 204 in the first region A and the top and sidewall surfaces of the second mask layer 204 on the top surfaces of the second fin 212 in the second region B, and to fill the first groove 209 and the second groove 210 and to expose a portion of the top surface of the second mask layer 204 on the top surface of the sacrificial fin 213 in the edge region of the second region B; and etching the sacrificial fin 213 using the mask layer as an etching mask to form a recess, the bottom surface of the recess may level with the surface of the semiconductor substrate in second region B.

After forming the recess, the mask layer is removed. The mask layer may be made of an organic material. The process for removing the mask layer may include an ashing process.

Returning to FIG. 14, after removing the sacrificial fin, the sacrificial layer may be removed (S110). FIG. 12 illustrates a corresponding structure.

As shown in FIG. 12, after removing the sacrificial fin 213 in the edge region of the second region B, the first sacrificial layer 208 may be removed. Accordingly, the sidewall surfaces of the first fin 211, the sidewall surfaces of the second fin 212, and the top surface of the semiconductor substrate 200 may be exposed.

The first sacrificial layer 208 may be removed by any appropriate process. In one embodiment, the first sacrificial layer 208 is removed by an ashing process. The parameters of the ashing process may include following values. The gas used in the ashing process may include $N_2$ and $H_2$, etc. The flow rate of $N_2$ may be in a range of approximately 2000 sccm-4000 sccm. The flow rate of $H_2$ may be in a range of approximately 300 sccm-1000 sccm. The chamber pressure may be in a range of approximately 200 mTorr-900 mTorr. The power of the RF source may be in a range of approximately 1000 W-2700 W. The temperature of the ashing process may be in a range of approximately 100° C.-350° C.

In another embodiment, the first sacrificial layer 208 may be removed during removing the mask layer.

Returning to FIG. 14, after removing the first sacrificial layer, an isolation structure may be formed (S111). FIG. 13 illustrates a corresponding structure.

As shown in FIG. 13, an isolation structure 220 may be formed on the surface of the first region A of the semiconductor substrate 200. The isolation structure 220 may cover portions of the sidewall surfaces of the first fins 211.

The isolation structure 220 may also be formed on the surface of the second region B of the semiconductor substrate 200; and cover portions of the sidewall surfaces of the second fins 212.

The process for forming the isolation structure 220 may include forming an initial isolation film on the semiconductor substrate 200 to cover top surfaces of the first fins 211 and the top surface of the mask layer 204 on the second fins 212; planarizing the initial isolation film until the top surfaces of the first fins 211 and the second fins 212 are exposed; and etching back the initial isolation film form the isolation structure 220.

The distance between the top surface of the isolation structure 220 and the surface of the first edge region of the semiconductor substrate 200 may be in a range of approximately 500 angstroms-600 angstroms.

The first region A and the second region B may be used to form different types of semiconductor devices. Because the first region A of the semiconductor substrate may include the first middle region and the first edge region. The surface of the first middle region of the semiconductor substrate may be higher than the surface of the first edge region of the semiconductor substrate. The first fins may be formed in the first middle region of the semiconductor substrate. The isolation structure may cover the sidewall surfaces of the first fins. Thus, the isolation structure may cover the surface of the first middle region of the semiconductor substrate. Further, the thickness of the isolation structure in the first region may be substantially small; and the thickness of the isolation structure in the first edge region may be substantially large.

Because the thickness of the isolation structure in the first edge region may be substantially large, the first region A and the second region B may be well isolated. Further, because the thickness of the isolation structure in the first region may be substantially small, the sidewall surfaces of the first fins may be covered less. Accordingly, the semiconductor device formed in the first fins may be substantially close to the semiconductor substrate. Thus, the heat generated by the semiconductor device may be easily transferred to the semiconductor substrate; and the heat dissipation may be substantially fast. Accordingly, the self-heating effect of the semiconductor device may be reduced. Further, the heights of the first fins higher than the isolation structure may be substantially the same. Thus, the performance of the semiconductor device may be substantially stable; and the performance of the semiconductor device may be improved.

The initial isolation film may be made of any appropriate material, such as silicon oxide, or silicon nitride, etc. In one embodiment, the initial isolation film is made of silicon oxide.

Various processes may be used to form the initial isolation film. In one embodiment, an flowable chemical vapor deposition (FCVD) process is used to form the initial isolation film. The FCVD process may include forming a silicon-containing precursor layer on the semiconductor substrate 200 to fill the first trench 207, the first groove 209, and the second groove 209 and cover the top and sidewall surfaces of the first fins 211 and the top and sidewall surfaces of the second fins 212; and oxidizing the silicon-containing precursor layer to form the initial isolation material film; and annealing the initial isolation material film to form the initial isolation film.

In some embodiments, the initial isolation film may also be formed by a plasma-enhanced chemical vapor deposition (PECVD) process, or a high aspect ratio chemical vapor deposition (HARP) process, etc.

In another embodiment, after forming the second fins 212 and the sacrificial fin 213, an isolation structure 220 may be formed on the surface of the semiconductor substrate 200. The isolation structure 220 may cover portions of the sidewall surfaces of the first fins 211 and portions of the sidewall surfaces of the second fins 212.

Before forming the isolation structure 220, the second mask layer 204 and the protective layer 202 may be removed from the top surfaces of the first sacrificial layer 208 and the first fins 211; and the sacrificial fin 213 in the second region B may be removed. The second mask layer 204 in the second region B and the protective layer 202 on the top surfaces of the second fins 212 may be removed. The top surfaces of the second fins 212 may be exposed.

In particular, the method for forming the isolation structure 220 may include forming a first isolation film (not shown) on the semiconductor substrate 200. The first isolation film may fill the first groove 209 and the second groove 209 and cover the top and sidewall surfaces of the second mask layer 204 and the top surface of the first sacrificial layer 208. Then, the first isolation film may be planarized until the top surfaces of the first fins 211 and the second fins 212 are exposed to form a first isolation layer on the semiconductor substrate. The first isolation layer may cover the sidewall surfaces of the first fins 211 and the second fins 212. Further, the method may include forming a patterned layer (not shown) on the surface of the first isolation layer to expose the surface of the first isolation layer and the top surface of the second fin 212 in the most edge portion of the second region B. Further, the method may include etching the first isolation layer and the second fins 212 in the most edge portion of the second region B until the top surface of the semiconductor substrate 200 is exposed using the patterned layer as an etching mask. After etching the first isolation layer and the second fins 212 at the most edge portion of the second region B, the first sacrificial layer 208 may be removed to expose the top surface and portions of the sidewall surfaces of the first fins 211. After removing the first sacrificial layer 208, a second isolation film (not shown) may be formed on the semiconductor substrate 200 to cover the top surface of the first isolation layer, the sidewall and top surfaces of the first fins 211, and the top surface of the semiconductor substrate 200 in the most edge region of the second region B of the semiconductor substrate 200. Further, the method may include planarizing the second isolation film until the top surfaces of the first fins 211 and the top surfaces of the second fins 212 are exposed; and etching back the second isolation film and the first isolation layer to form the isolation structure 220.

The present disclosure also provides a semiconductor device. FIG. 13 illustrates a corresponding semiconductor device.

As shown in FIG. 13, the semiconductor device may include a semiconductor substrate 200 having a first region A. The first region A may include a first middle region and an adjacent first edge region; and the first edge region may surround the first middle region. The surface of the first middle region of the semiconductor substrate 200 may be higher than the surface of the first edge region of the semiconductor substrate 200. Further, the semiconductor device may include a plurality of first fins 211 discretely formed on the surface of the first region of the semiconductor substrate 200; and an isolation structure 220 formed on the surface of the first middle region and the first edge region of the semiconductor substrate 200. The isolation structure 220 may cover portions of the sidewall surfaces of the first fins 211. The detailed structures and intermediate structures are described above with respect to the fabrication processes.

The conductive types of the semiconductor devices formed in the first region A may be the same.

The semiconductor substrate 200 may also include a second region B. The types of the semiconductor devices formed in the first region A and the second region B may be opposite. Further, the semiconductor device may include a plurality of second fins formed on the second region B of the semiconductor substrates 200. The isolation structure 220 may also cover portions of the sidewall surfaces of the second fins 212.

When the number of the second fins 212 is greater than one, the second region B of the semiconductor substrate 200 may also include a second middle region and a second edge region. The surface of the second middle region of the semiconductor substrate 200 may be higher than the surface of the second edge region of the semiconductor substrate 200.

The distance between the top surface of the first fin 211 and the surface of the first edge region of the semiconductor substrate 200 may be in a range of approximately 1000 angstroms-1500 angstroms.

The distance between the top surface of the first fin 211 and the surface of the first edge region of the semiconductor substrate 200 may be in a range of approximately 600 angstroms-900 angstroms.

The distance between the top surface of the isolation structure 220 and the surface of the first edge region of the semiconductor substrate 200 may be in a range of approximately 500 angstroms-600 angstroms.

In the disclosed semiconductor device, the semiconductor substrate may include a first middle region and a first edge region. The surface of the first middle region of the semiconductor substrate may be higher than the surface of the first edge region of the semiconductor substrate. The first fins may be formed on the first middle region. The isolation structure may cover portions of the sidewall surfaces of the first fins; and the surface of the isolation structure may be substantially flat. The isolation structure may be substantially thin in the first middle portion; and may be substantially thick in the first edge region. Because the isolation structure of the first edge region may be substantially thick, the field isolation between the semiconductor device in the first region and the surrounding semiconductor devices may be realized. Because the isolation structure in the first middle region may be substantially thin, the sidewall surfaces of the first fins may be covered less. Accordingly, the semiconductor device formed on the first fin may be more close to the base substrate; and the heat may be easily conducted to the base substrate; and the heat dissipation may be substantially fast. Thus, the self-heating effect of the semiconductor device may be reduced. Further, and the height of the first fins higher than of the isolation structure may be substantially the same. Thus, the performance of the semiconductor device may be substantially stable, and the performance of the semiconductor device may be improved.

In the disclosed method for forming a semiconductor device, a first trench and a first groove may be formed in a base substrate to form a first region of the semiconductor substrate. The bottom surface of the first groove may be lower than the bottom surface of the first trench. The bottom surface of the first groove and the bottom surface of the first trench may have a depth difference. An isolation structure may be formed on the surface of the first region of the semiconductor substrate; and the surface of the isolation structure may be substantially flat. Portions of the isolation structure covering the surface of the first region of the semiconductor substrate may have a height difference. The portion of the isolation structure covering the first groove may be substantially thick; and the portion of the isolation structure covering the first trench may be substantially thin. In particular, the portion of the isolation structure in the first middle region may be substantially thin; and the portion of the isolation structure in the first edge region may be substantially thick. Because the isolation structure in the first edge region may be substantially thick, the field isolation between the semiconductor device in the first region and the surrounding semiconductor device may be realized. Because the isolation structure in the first middle region may be substantially thin, the sidewall surfaces of the first fins may be covered less. Correspondingly, the semiconductor device formed in the first fin may be closer to the base substrate, and the heat may be easily conducted to the base substrate; and the heat dissipation may be substantially fast; and the self-heating effect of the semiconductor device may be reduced. Further, the heights of the first fins higher than the isolation structure may be substantially the same. Thus, the performance of the semiconductor device may be substantially stable; and the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
   a semiconductor substrate having a first region, wherein the first region includes a first middle region and a first edge region adjacent to and surrounding the first middle region, and a surface of the first middle region of the semiconductor substrate is higher than a surface of the first edge region of the semiconductor substrate;
   a plurality of first fins formed discretely on the first middle region of the semiconductor substrate; and
   an isolation structure, formed on the first middle region of the semiconductor substrate and the first edge region of the semiconductor substrate and covering portions of sidewall surfaces of the first fins;
   wherein:
      a portion of the isolation structure on the first middle region of the semiconductor substrate has a top surface coplanar with a top surface of a portion of the isolation structure on the first edge region of the semiconductor substrate; and
      the portion of the isolation structure on the first middle region of the semiconductor substrate has a bottom surface higher than a bottom surface of the portion of the isolation structure on the first edge region of the semiconductor substrate.

2. The semiconductor device according to claim 1, wherein:
   the semiconductor substrate comprises a second region, wherein:
      conductivity types of devices formed in the first region and the second region are opposite;
      the semiconductor device further includes a plurality of second fins formed on the second region of the semiconductor substrate; and
      the isolation structure also covers portions of sidewall surfaces of the second fins.

3. The semiconductor device according to claim 2, wherein:
   more than one second fin are formed on the second region.

4. The semiconductor device according to claim 3, wherein:
   the second region of the semiconductor substrate includes a second middle region and a second edge region; and
   a surface of the second middle region of the semiconductor substrate is higher than a surface of the second edge region of the semiconductor substrate.

5. The semiconductor device according to claim 1, wherein:
   a distance between a top surface of the first fin and a surface of the first edge region of the semiconductor substrate is in a range of approximately 1000 angstroms-1500 angstroms.

6. The semiconductor device according to claim 5, wherein:
   a distance between the top surface of the first fin and a surface of the first middle region of the semiconductor substrate is in a range of approximately 600 angstroms-900 angstroms.

7. The semiconductor device according to claim 5, wherein:
   a distance between a top surface of the isolation structure and the surface of the first edge region of the semiconductor substrate is in a range of approximately 500 angstroms-600 angstroms.

8. The semiconductor device according to claim 1, wherein:
   conductivity types of devices formed in the first region of the semiconductor substrate are same.

* * * * *